(12) United States Patent
Tatum et al.

(10) Patent No.: US 6,853,007 B2
(45) Date of Patent: Feb. 8, 2005

(54) SUBMOUNT FOR VERTICAL CAVITY SURFACE EMITTING LASERS AND DETECTORS

(75) Inventors: Jimmy A. Tatum, Plano, TX (US); James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/028,288

(22) Filed: Dec. 28, 2001

(65) Prior Publication Data

US 2003/0122142 A1 Jul. 3, 2003

(51) Int. Cl.[7] .............................................. H01L 27/15
(52) U.S. Cl. ........................... 257/79; 257/13; 257/80; 257/82; 257/93; 257/99; 257/918
(58) Field of Search ............................... 257/13, 79–82, 257/93, 98, 99, 340, 368, 918, 89

(56) References Cited

U.S. PATENT DOCUMENTS

| | | | |
|---|---|---|---|
| 5,068,869 A | 11/1991 | Wang et al. | |
| 5,222,002 A | 6/1993 | Chun et al. | |
| 5,298,768 A | * 3/1994 | Okazaki et al. | 257/81 |
| 5,468,999 A | 11/1995 | Lin et al. | |
| 5,625,732 A | * 4/1997 | Chun et al. | 385/88 |
| 5,940,562 A | 8/1999 | Henson et al. | |
| 6,447,174 B1 | 9/2002 | Trezza | |

FOREIGN PATENT DOCUMENTS

| | | |
|---|---|---|
| EP | 0 550 996 A1 | 7/1993 |
| EP | 0 630 174 B1 | 12/1994 |
| EP | 0 630 174 A1 | 12/1994 |
| JP | 09223848 | 8/1997 |

OTHER PUBLICATIONS

"Fundamental Study of Parallel Moduling Scheme Based on a Micro–Optical Bench and Collimating Planar Micro-lenses," Yasuhiko Aoki et al., Japanese Journal of Applied Physics, Publication Office Japanese Journal of Applied Physics, Tokyo, Japan, vol. 39, No. 3B, Mar. 2000, pp. 1529–1532.

"Highly Uniform Vertical–Cavity Surface–Emitting Lasers Integrated with Microlens Array," S. Eitel et al., IEEE Photonics Technology Letters, IEEE Inc., New York, vol. 12, No. 5, May 2000. pp. 1041–1135.

(List continued on next page.)

*Primary Examiner*—Long Pham
*Assistant Examiner*—Wai-Sing Louie
(74) *Attorney, Agent, or Firm*—Workman Nydegger (57) ABSTRACT

A semiconductor assembly having a submount with a plurality of conductive traces. A semiconductor array, such as a VCSEL array or a detector array, is attached to the submount. A plurality of conductive vias pass through the submount's body, or a conductive trace is disposed between a lower portion and an upper portion of the submount. Bonding wires electrically connect the individual semiconductor elements to conductive traces, while the conductive vias (or the conductive trace between the lower and upper portions) can provide additional electrical connections. The submount is beneficially of a ceramic material, and the conductive traces can include conductive pads for connecting to a printed circuit board or to a flex board. Locating features can extend from the submount, and an optical element can mount to the locating features. Alternatively, the locating features can be used to arrange the semiconductor assembly relative to an external structure.

22 Claims, 7 Drawing Sheets

OTHER PUBLICATIONS

"Parallel Optical–Transmission Module Using Vertical–Cavity Surface–Emitting Laser Array and Micro–Optical Bench (MOB)," Yuji Shimada et al., Japanese Journal of Applied Physics, Publictaion Office Japanese Journal of Applied Physics, Tokyo, Japan, vol. 40, No. 2A, Part 2, Feb. 1, 2001, pp. L114–L116.

"Manufacturability of VCSEL Components and VCSEL Products," Jim A. Tatum et al., Lasers and Electro–Optics Society Annual Meeting, IEEE Orlando, Florida, December 1, 1998, pp. 409–410.

S.W. McRoy and G. Hirst, "Race–Based Parsing and Syntactic Disambiguation," Cognitive Science 14:313–353 (1990).

* cited by examiner

SUBMOUNT FOR VERTICAL CAVITY SURFACE EMITTING LASERS AND DETECTORS

CROSS-REFERENCE TO RELATED APPLICATIONS

Not applicable.

BACKGROUND OF THE INVENTION

1. Field of the Invention

This invention relates to vertical cavity surface emitting laser arrays and to detector arrays. More specifically, it relates to submounts for vertical cavity surface emitting laser arrays and for detector arrays.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. VCSELs can be formed from a wide range of material systems to produce specific characteristics. VCSELs are relatively complex devices having active regions, distributed Bragg reflector (DBR) mirrors, current confinement structures, substrates, and contacts.

Figure 1:
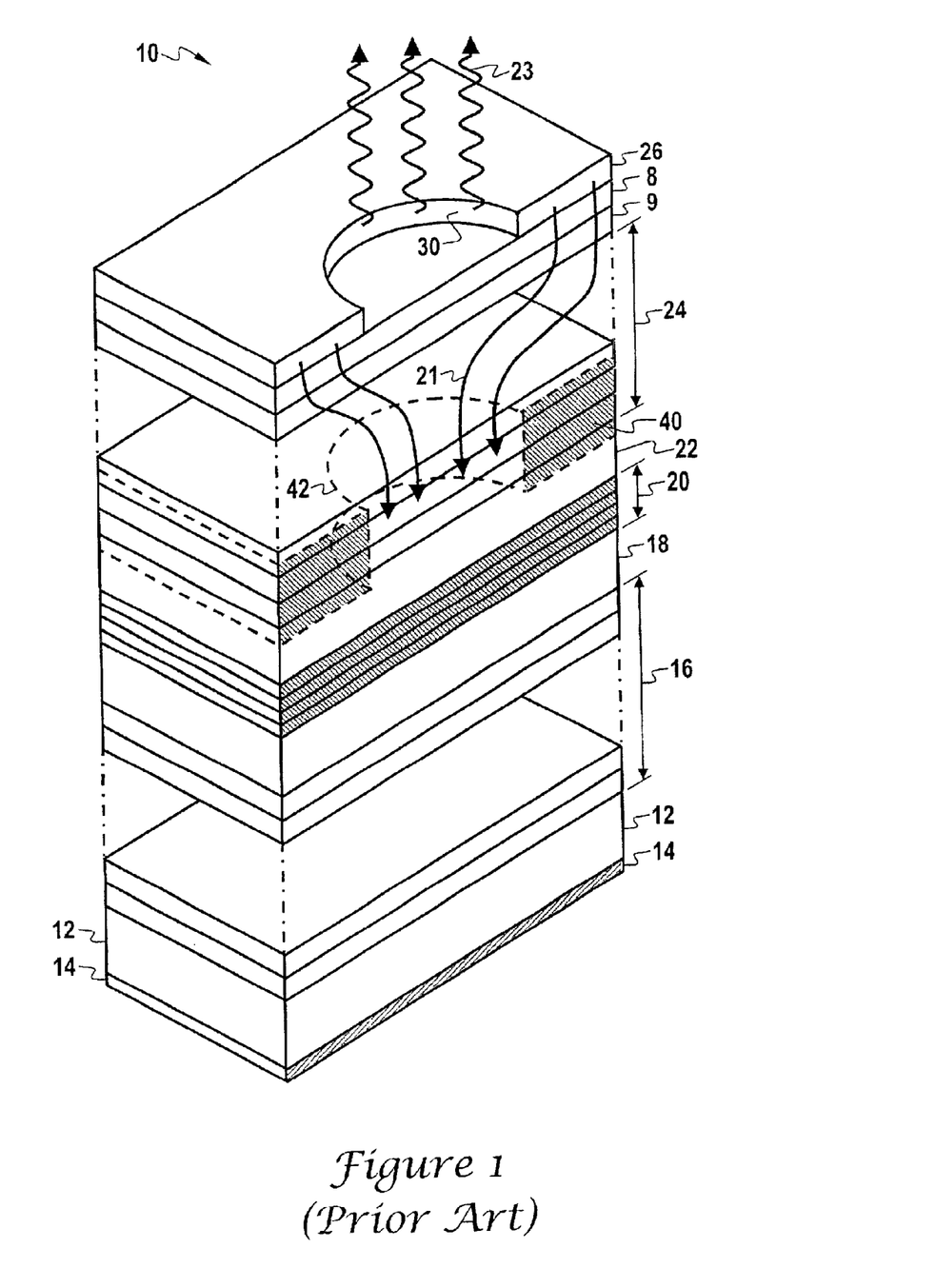
FIG. 1 illustrates a typical vertical cavity surface emitting laser.

FIG. 1 illustrates a typical VCSEL 10. As shown, an n-doped gallium arsenide (GaAS) substrate 12 has an n-type electrical contact 14. An n-doped lower mirror stack 16 (a DBR) is on the GaAS substrate 12, and an n-type graded-index lower spacer 18 is disposed over the lower mirror stack 16. An active region 20 having a plurality of quantum wells is formed over the lower spacer 18. A p-type graded-index top spacer 22 is disposed over the active region 20, and a p-type top mirror stack 24 (another DBR) is disposed over the top spacer 22. Over the top mirror stack 24 is a p-conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. Because an optical cavity is resonant at specific wavelengths, the mirror separation is controlled to resonate at a predetermined wavelength (or at a, multiple thereof). At least part of the top mirror stack 24 includes an insulating region 40 that is usually formed either by implanting protons into the top mirror stack 24 or by forming an oxide layer. The insulating region 40 surrounds a conductive annular central opening 42. Thus, the central opening 42 forms an electrically conductive path though the insulating region 40.

In operation, an external bias causes an electrical current 21 to flow from the p-type electrical contact 26 toward the n-type electrical contact 14. The insulating region 40 and the conductive central opening 42 confine the current 21 flow through the active region 20 where some of the electrons are converted into photons. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

Figure 2:
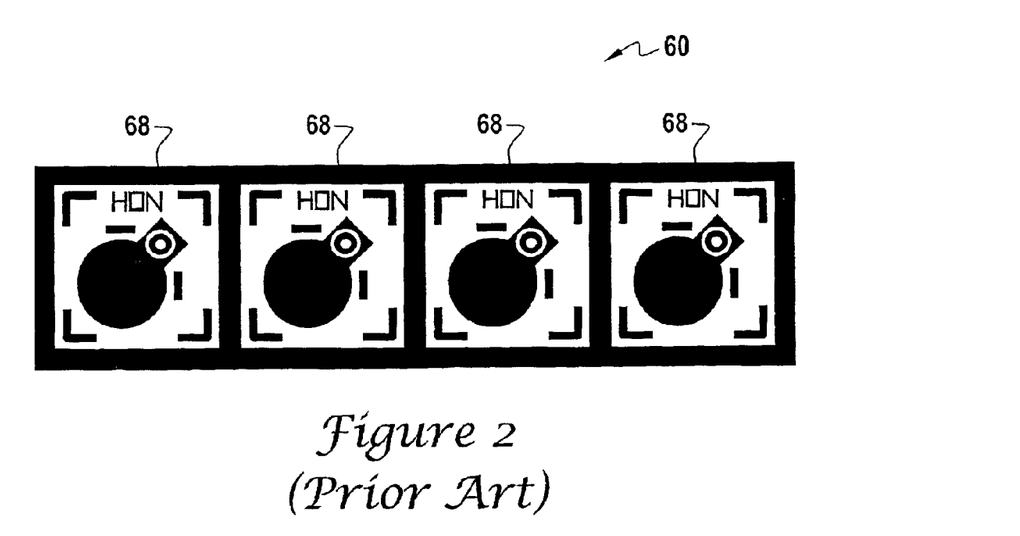
FIG. 2 illustrates a top down view of a typical 4 element VCSEL array.
Figure 3:
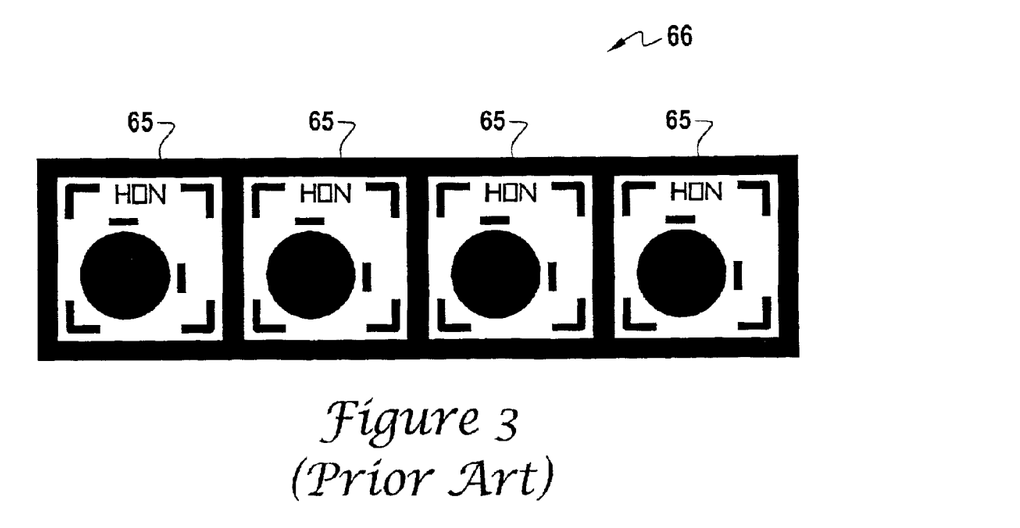
FIG. 3 illustrates a top down view of a typical 4 element detector array.

It should be understood that FIG. 1 illustrates a typical VCSEL, and that numerous variations are possible. For example, the dopings can be changed (say, by providing a p-type substrate 12 and reversing current flow), different material systems can be used, operational details can be varied, and additional structures, such as tunnel junctions, can be added. Furthermore, while individual VCSELs are of interest, many applications use an array of VCSEL elements. For example, FIG. 2 illustrates a VCSEL array 60 comprised of four individual VCSELs 68. For example, the VCSEL array 60 could be comprised of 4 VCSELs 68 that are each in accord with the VCSEL 10 shown in FIG. 1, with the light emitting regions of the individual VCSELs being separated by 250 microns. Additionally, many applications require a detector array that mates with the VCSEL array 60. Turning now to FIG. 3, such a detector array 66 can be comprised of individual photodetectors 65 that are spaced apart the same distance as the individual VCSELs 68 in the VCSEL array 60. While FIGS. 2 and 3 show arrays comprised of 4 elements, other arrays will have different numbers of elements (with 4 and 12 element arrays being fairly common).

While generally successful, VCSEL arrays and matching detector arrays have problems. For example, many VCSEL arrays and/or detector arrays are mounted by direct attachment of the VCSEL/detector array substrate to another structure, such as a printed circuit board or a chip carrier. To assist attachment, VCSEL/detector array substrates are usually relatively large, which adds significantly to their cost. Furthermore, in many applications the electrical connections to and from a VCSEL/detector array substrate are made using tab bonding. Such bonding is problematic with frequently used GaAs substrates. Additionally, in some applications VCSEL/detector array substrates have been difficult to use because physical alignment mechanisms are needed, and incorporating such alignment mechanisms on a substrate was difficult.

Therefore, a new technique of mounting VCSEL and detector arrays would be beneficial. Even more beneficial would be a new technique of mounting VCSEL and detector arrays on a submount that enables a reduction in the size of the semiconductor array. Even more beneficial would be an electrically connected structure that facilitates handling and testing prior to incorporation of that structure into a higher level assembly. Still more beneficial would be a new technique of mounting VCSEL and detector arrays on a submount that assists tab bonding of electrical connections, and that includes alignment structures for both optical and mechanical assembly.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Accordingly, the principles of the present invention provide for a new technique of mounting VCSEL and detector arrays using a submount. Beneficially, that submount enables a semiconductor assembly that permits a reduction in size of a semiconductor array substrate, and that assists providing electrical connections. Also beneficially, such a semiconductor assembly includes alignment features, standoffs, and electrically conductive pads.

A semiconductor assembly according to the principles of the present invention includes a submount having a plurality of conductive traces on a first surface, and a plurality of conductive vias that pass through the submount's body. A semiconductor array of individual semiconductor elements is attached to the submount such that the individual semiconductor elements are electrically connected to the conductive vias. Furthermore, bonding wires electrically connect the individual semiconductor elements to the conductive traces. The conductive paths can be designed to implement controlled impedances.

An alternative semiconductor assembly according to the principles of the present invention includes a submount having a lower portion, a conductive trace on the lower portion, an upper portion over the lower portion, and a plurality of conductive traces on the upper portion. The lower portion and the conductive trace on the lower portion extend beyond the upper portion to define a mounting surface. A semiconductor array of individual semiconductor elements is attached to the mounting surface such that the semiconductor array is electrically connected to the conductive trace on the lower portion. Additionally, a plurality of bonding wires electrically connects the individual semiconductor elements to a plurality of conductive traces on the upper portion.

In either embodiment, beneficially the semiconductor array is either a VCSEL array or a detector array. Furthermore, the submount is beneficially comprised of a ceramic material. The conductive traces can include conductive pads, and a printed circuit board or a flex board can connect to the conductive pads. Additionally, locating features can extend from the submount, and an optical element can attach to the locating features. Alternatively, the locating features can be used to arrange the semiconductor assembly relative to an external feature.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWING

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

In the drawings.

Note that in the drawings that like numbers designate like elements, Additionally, for explanatory convenience this document uses directional signals such as up and down, top and bottom, and lower and upper. Those signals are derived from the relative positions of the elements as illustrated in the drawings. Such signals are meant to aid understanding the present invention, not to limit it.

DETAILED DESCRIPTION OF THE ILLUSTRATED EMBODIMENTS

The principles of the present invention provide for new technique of mounting VCSEL and detector arrays using a submount. That technique is explained with reference to embodiments that are illustrated in the accompanying drawings and that are described below.

Figure 4:
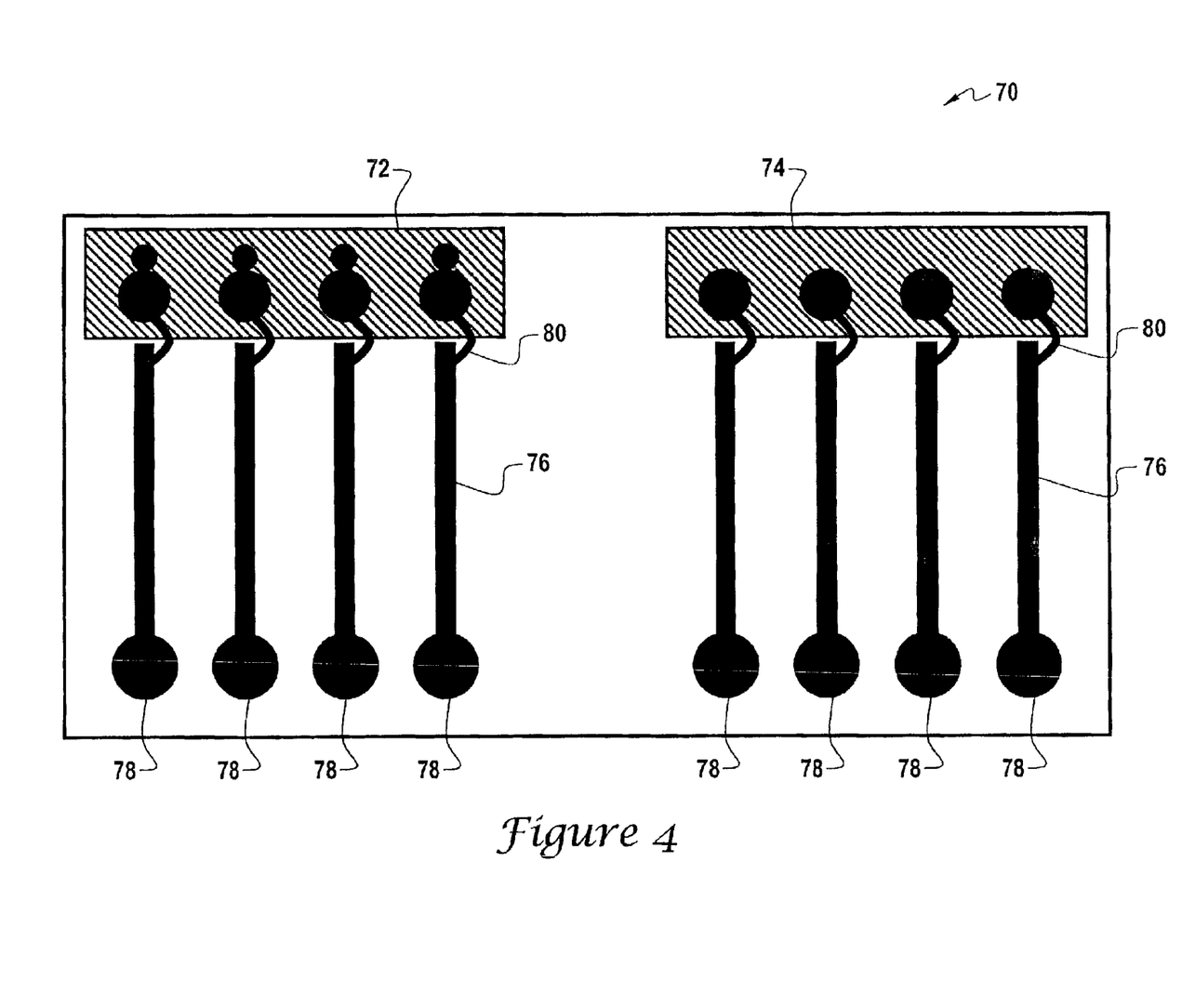
FIG. 4 illustrates a top down view of a VCSEL array and a detector array on a submount that is in accord with the principles of the present invention.

Refer now to FIG. 4 for a top down view of a first embodiment submount 70 that includes a VCSEL array 72 (on the left side) and a detector array 74 (on the right side). The body of the submount 70 is beneficially comprised of a ceramic material having conductive patterns and structures as described in more detail subsequently. Ceramic is particularly beneficial because of high thermal conductivity which minimizes the thermal gradients in the assembly. Ceramics are also beneficial because of their structure stability, reasonable cost, and wide availability. An alternative body material is silicon. While FIG. 4 illustrates both a VCSEL array 72 and a detector array 74, typically a particular submount 70 would have either a VCSEL array or a detector array.

Still referring to FIG. 4, the submount 70 includes a plurality of conductive patterns 76 that terminate at one end in conductive pads 78. The other end of the conductive patterns 76 terminate close to either the VCSEL array 72 or to the detector array 74. Bonding leads 80 are used to connect the individual VCSEL/detector elements to the conductive patterns 76.

Figure 5:
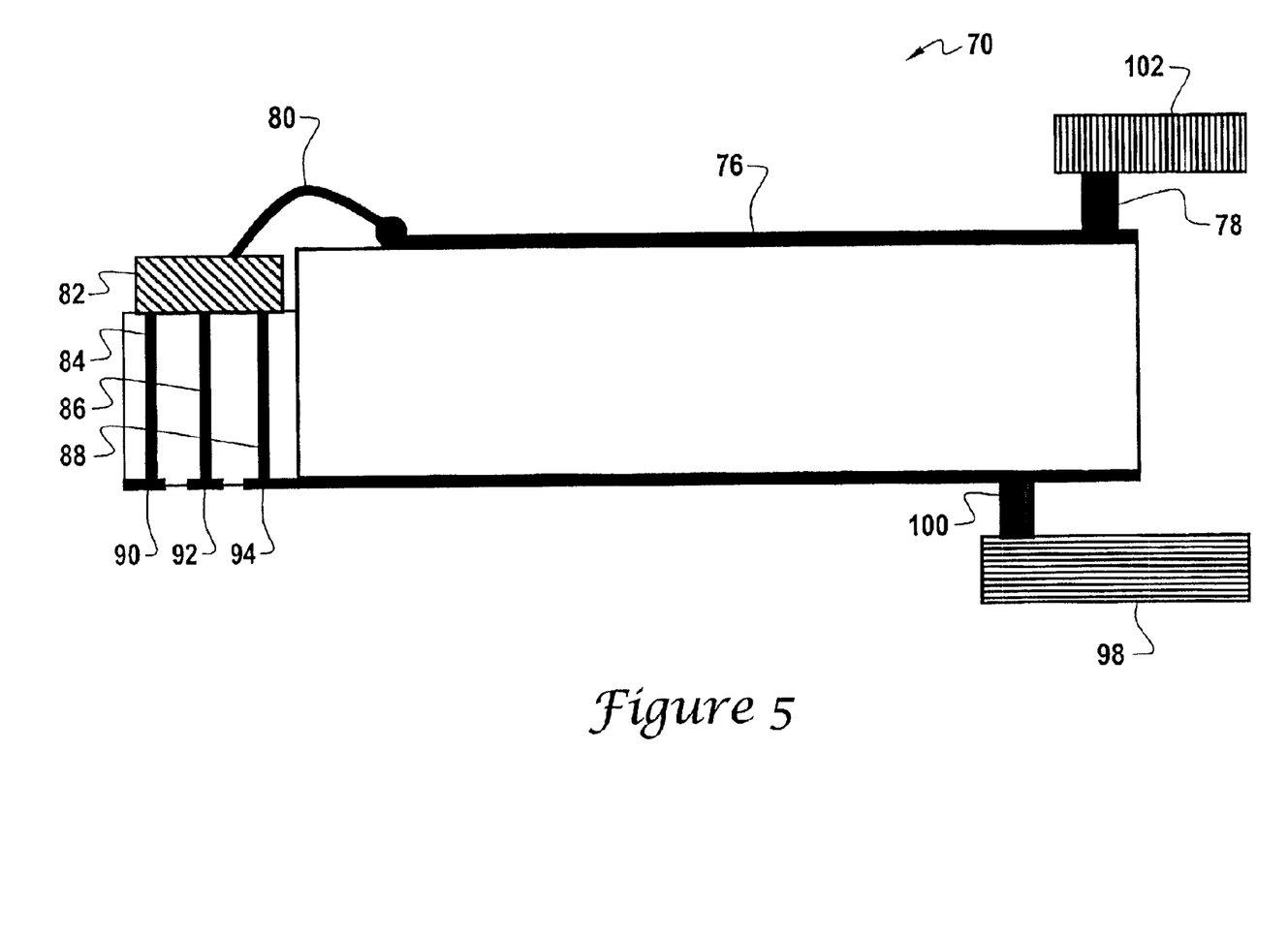
FIG. 5 illustrates a side cut-way view of the submount of FIG. 4.

FIG. 5 illustrates a cross-sectional view of the submount 70. As shown, the submount 70 includes conductive vias 84, 86, and 88 that extend from below a VCSEL array 72 or a detector array 74 (generically shown as element 82) through the width of the submount 70. The submount 70 also includes conductive traces 90, 92, and 94 on its bottom side that electrically connect, respectively, to the vias 84, 86, and 88. The element 82 also electrically connects to the vias 84, 86, and 88. Thus, signals applied to and from the conductive traces 90, 92, and 94 pass through the vias 84, 86, and 88 to and from the element 82. Furthermore, another electrical signal can be applied to the element 82 by bonding leads 80 (see FIG. 4) that attach to the conductive patterns 76. These bonding leads can be made very short by mounting the semiconductor device such that the top of the chip is at or below the surface level of the submount assembly. Mounting the semiconductor array device at or below the surface of the submount also provides mechanical protection of the semiconductor from external objects. Thus, electrical signals applied to and from the conductive pads 78 can pass to and from the element 82. The conductive traces and vias can be formed using normal fabrication techniques. It should be understood that either fewer or more vias could be used in the submount assembly.

FIG. 5 also illustrates a tab bond film 98 that is connected to a lower conductive pad 100. A printed circuit board 102 can be connected to a conductive trace 78. Either or both contact forms may be present, and either surface may be contacted by either type of structure. Thus, the submount 70 assists routing electrical signals between external structures, such as tab bonding connectors and printed circuit boards, and the element 82. Alternatively, or in addition, electrical connections can be made by other devices, such as wire bonding or solder bumps.

Figure 6:
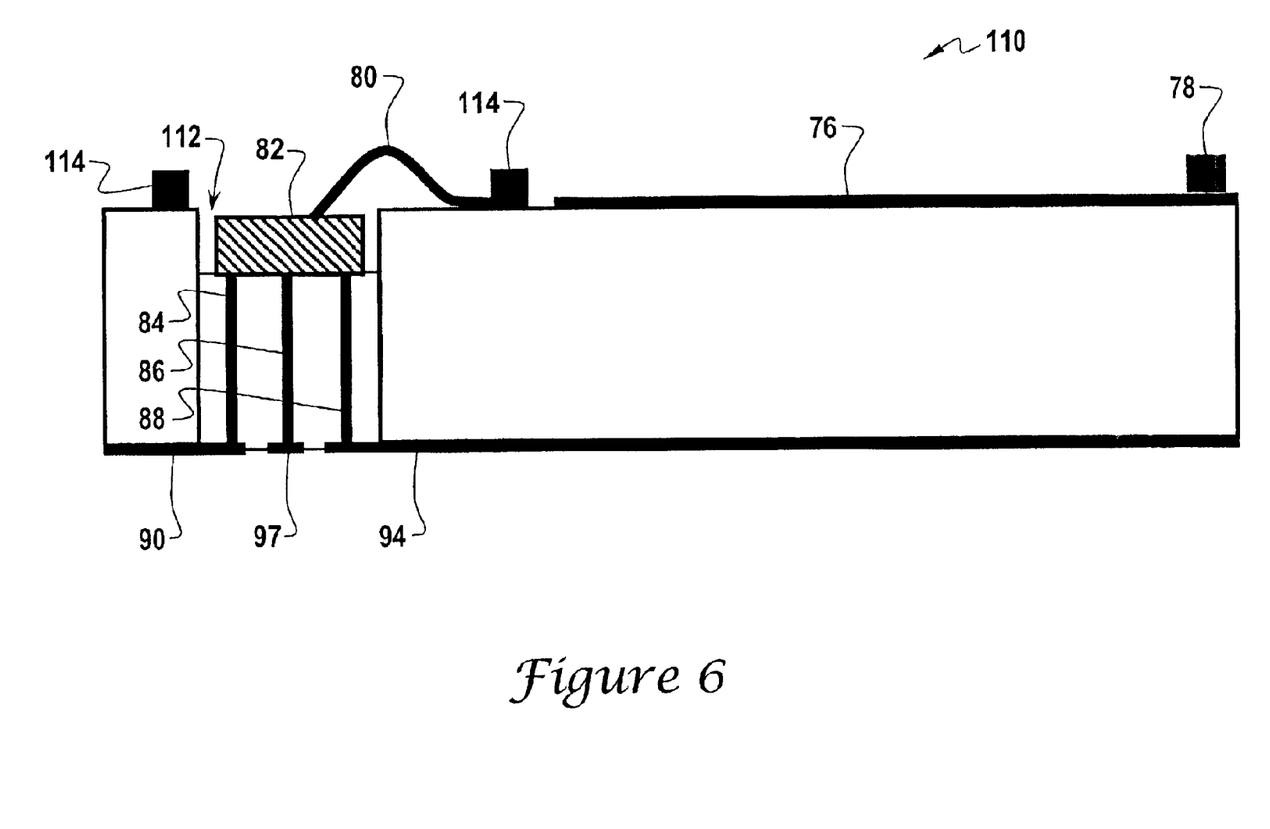
FIG. 6 illustrates a side cut-way view of an alternative submount.

While the submount 70 illustrated in FIG. 5 is advantageous for many applications, at times it is beneficial to be able to mount an external feature relative to a VCSEL array or to a detector array. FIG. 6 illustrates a cross-sectional view of an alternative submount 110. The submount 110 includes both a mounting well 112 and locating spacers 114. The mounting well 112 accurately locates the element 82 (a VCSEL array or a detector array) below the top surface of the submount 110. This both protects the element 82 from physical damage and assists locating an external optical coupler relative to the element 82. The locating spacers 114 are useful for accurately locating and spacing an external element or structure (such as a lens) relative to the element 82. The locating spacers 114 can also be useful for positioning the submount 110 relative to an external structure. Furthermore, the locating spacers 114 can be electrically conductive. This enables electrical communication with the element 82 through a locating spacer 114.

Figure 7:
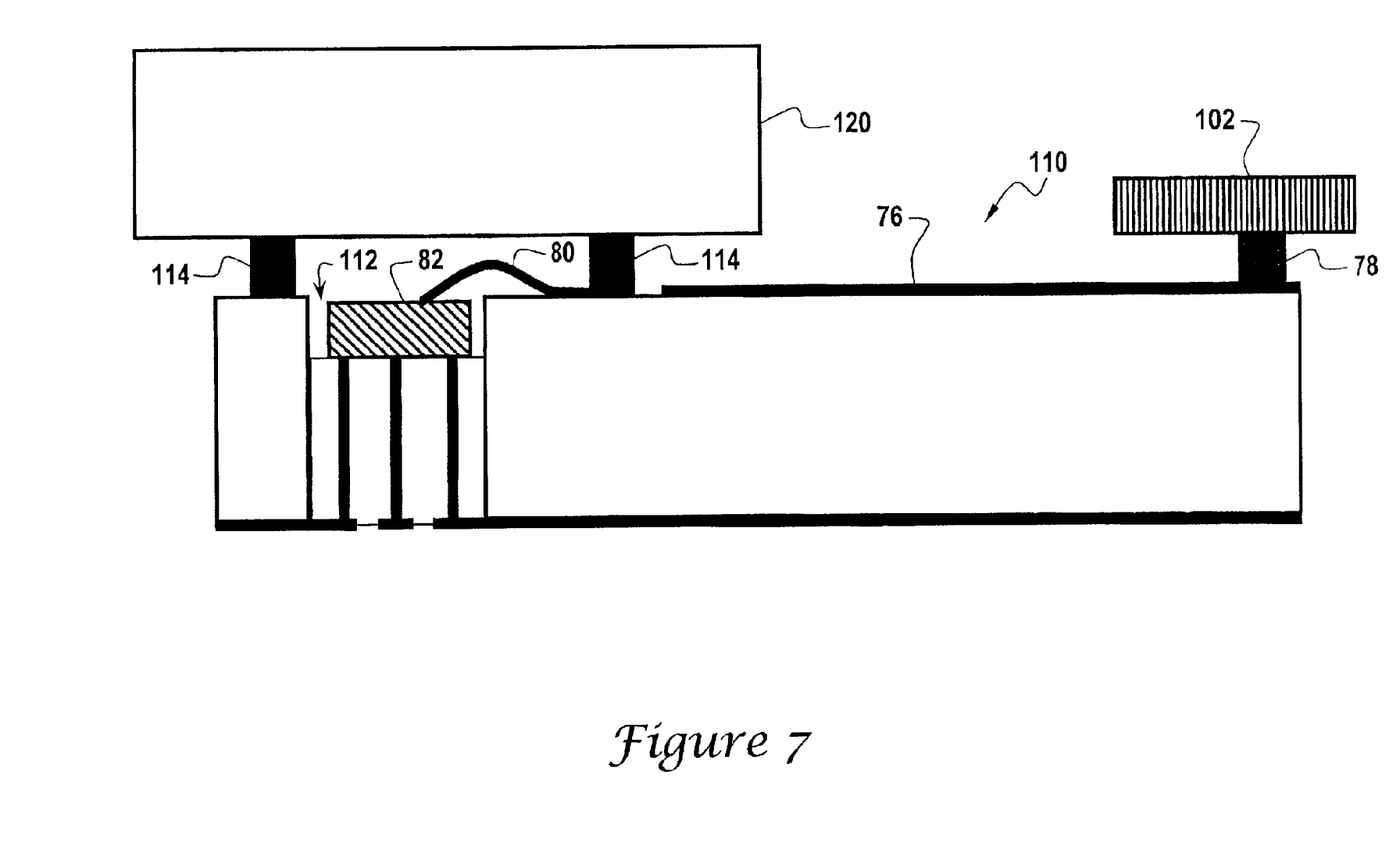
FIG. 7 illustrates a variation of the submount shown in FIG. 6.

FIG. 7 illustrates the submount 110 with an external optical coupler (such as a lenslet array) mounted over the mounting well 112 and on the locating spacers 114. Furthermore, FIG. 7 illustrates a printed circuit board 102 electrically connected to the submount 110 via connector pads 78.

Figure 8:
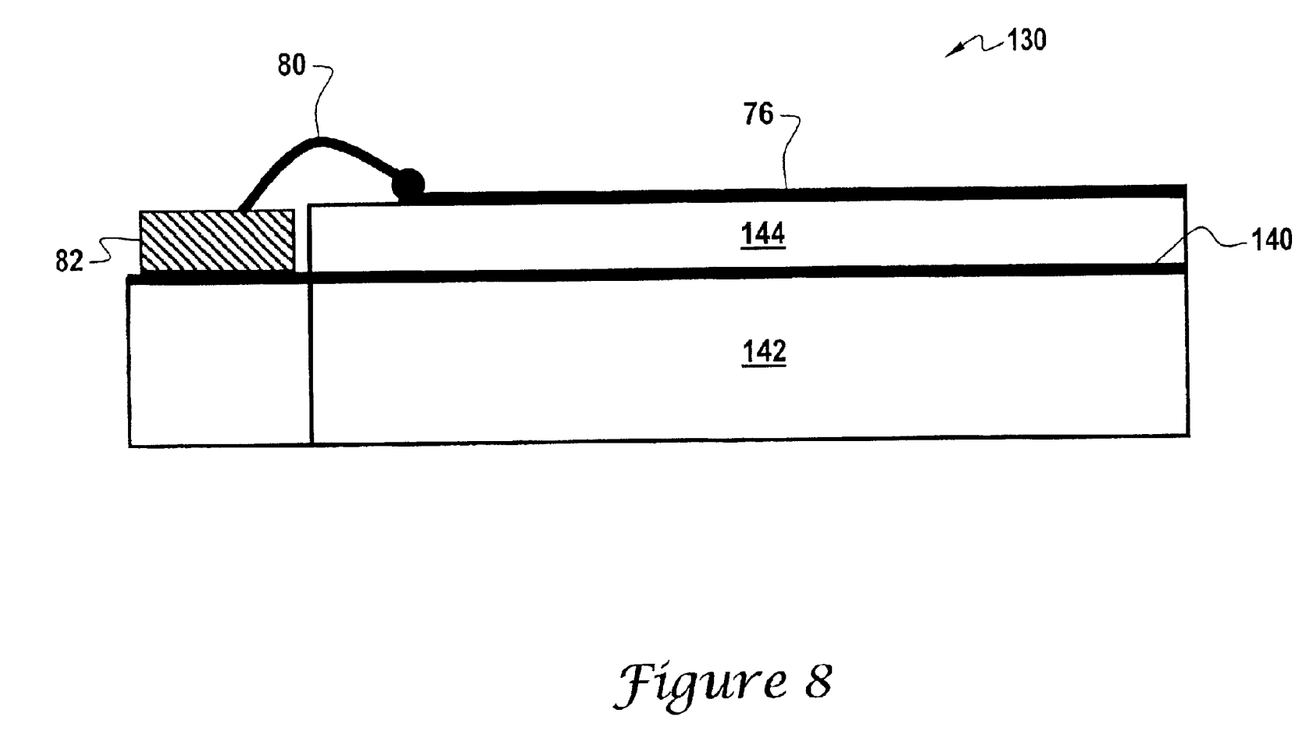
FIG. 8 illustrates a side cut-way view of another alternative submount.

While FIGS. 4–7 illustrate useful submounts, those submounts have a disadvantage in that they require vias that pass through the submount body. FIG. 8 illustrates an alternative submount 130 that does not require vias. As shown, the submount 130 includes a conductive trace 140 that is disposed between a lower portion 142 of the submount 130 and an upper portion 144. Furthermore, a top conductive pattern 76 (see FIG. 4) is disposed over the top of the upper portion 144. Thus, the submount 140 includes multiple metal layers. The conductive trace 140 electrically connects to the bottom of an element 82 (a VCSEL array or a detector array) and enables electrical signals to be applied to or received from the element 82. Additionally, another electrical signal can be applied to or received from the element 82 by a bonding lead(s) 80 that connects to the top conductive pattern 76. The conductive trace 140 and the top conductive pattern 76 can be formed using normal fabrication techniques.

Submounts according to the principles of the present invention are particularly beneficial because they enable standard sized dies to be used in multiple assemblies that may otherwise require customization of the semiconductor device. That is, the same VCSEL (or detector) design can be used to fabricated 4 element arrays, 5 element arrays, 12 element arrays, and so on using the submount to accommodate other mechanical considerations. This enables customer requirements to be meet by changing the submount, not the VCSEL. This can reduce the cost and speed assembly by enabling standard equipment and processes to be used to mount the VCSEL (or detector) dies.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A semiconductor assembly, comprising:
    a submount having a plurality of conductive traces on a surface and a plurality of conductive vias that pass through a body of the submount;
    a semiconductor array having a top portion and a bottom portion, the semiconductor array being comprised of semiconductor elements having first electrical contacts on the top portion and second electrical contacts on the bottom portion, said semiconductor array being attached to said submount such that said second electrical contacts of the semiconductor elements are electrically connected to said conductive vias; and
    a plurality of bonding wires electrically connecting said first electrical contacts of the semiconductor elements to at least two of the conductive traces.

2. A semiconductor assembly according to claim 1, wherein said semiconductor array includes a plurality of vertical cavity surface emitting lasers.

3. A semiconductor assembly according to claim 1, wherein said semiconductor array includes a plurality of detectors.

4. A semiconductor assembly according to claim 1, wherein said submount includes a mounting well, wherein said semiconductor array is in said mounting well, and wherein said semiconductor array includes a top surface that does not protrude from said mounting well.

5. A semiconductor assembly according to claim 1, wherein each of the conductive traces includes a contact pad.

6. A semiconductor assembly according to claim 5, further including a tab bonding connector electrically connected to a plurality of contact pads.

7. A semiconductor assembly according to claim 1, further including a locating spacer that extends from said submount.

8. A semiconductor assembly according to claim 7, further including an optical coupler on said locating spacer, wherein said optical coupler is aligned with said semiconductor array.

9. A semiconductor assembly according to claim 1, wherein said submount includes ceramic.

10. A semiconductor assembly according to claim 1, wherein at least one of said plurality of conductive vias electrically connects to one of the conductive traces.

11. A semiconductor assembly according to claim 1, further including a conductive pad electrically connected to one of the conductive traces.

12. A semiconductor assembly according to claim 11, further including a printed circuit board electrically connected to said conductive pad.

13. A semiconductor assembly, comprising:
    a submount comprised of a lower portion, a conductive trace on the lower portion, an upper portion over the lower portion, and a plurality of conductive traces on the upper portion, wherein the lower portion and the conductive trace on the lower portion extend beyond the upper portion to define a mounting surface;

a semiconductor array having a to portion and a bottom portion, the semiconductor array being comprised of a plurality of semiconductor elements having first electrical contacts on the top portion and second electrical contacts on the bottom portion, said semiconductor array being attached to said mounting surface such that said second electrical contacts of the plurality of the semiconductor elements are electrically connected to the conductive trace on the lower portion; and a plurality of bonding wires electrically connecting said first electrical contacts of the plurality of semiconductor elements to the plurality of conductive traces on the upper portion.

14. A semiconductor assembly according to claim 13, wherein said semiconductor array includes a plurality of vertical cavity surface emitting lasers.

15. A semiconductor assembly according to claim 13, wherein said semiconductor array includes a plurality of detectors.

16. A semiconductor assembly according to claim 13, wherein each of said plurality of conductive traces on the upper portion includes a contact pad.

17. A semiconductor assembly according to claim 16, further including a tab bonding connector electrically connected to the contact pad.

18. A semiconductor assembly according to claim 13, further including a locating spacer that extends from said submount.

19. A semiconductor assembly according to claim 18, further including an optical coupler on said locating spacer, wherein said optical coupler is aligned with said semiconductor array.

20. A semiconductor assembly according to claim 13, wherein said submount includes ceramic.

21. A semiconductor assembly according to claim 13, further comprising:

a plurality of contact pads on the submount; and a printed circuit board electrically connected to the plurality of contact pads.

22. A semiconductor assembly according to claim 13, wherein said submount includes a mounting well, wherein said semiconductor array is in said mounting well, and wherein said semiconductor array includes a top surface that does not protrude from said mounting well.

* * * * *

UNITED STATES PATENT AND TRADEMARK OFFICE
CERTIFICATE OF CORRECTION

PATENT NO. : 6,853,007 B2  Page 1 of 1
APPLICATION NO. : 10/028288
DATED : February 8, 2005
INVENTOR(S) : Tatum et al.

It is certified that error appears in the above-identified patent and that said Letters Patent is hereby corrected as shown below:

Column 1
Line 28, change "(GaAS)" to --(GaAs)--
Line 30, change "GaAS" to --GaAs--

Column 5
Line 28, after "optical coupler" insert --120--
Line 60, change "meet" to --met--
Line 61, after "speed" insert --of--

Column 7
Line 5, before "portion" change "to" to --top--

Signed and Sealed this

Twelfth Day of December, 2006

JON W. DUDAS
*Director of the United States Patent and Trademark Office*